(12) United States Patent
Lee

(10) Patent No.: US 8,675,277 B2
(45) Date of Patent: Mar. 18, 2014

(54) MULTI-LAYERED LENS SHEET FOR THREE-DIMENSIONAL LOOK

(76) Inventor: Joo Hyun Lee, Seoul (KR)

( * ) Notice: Subject to any disclaimer, the term of this patent is extended or adjusted under 35 U.S.C. 154(b) by 132 days.

(21) Appl. No.: 13/317,000

(22) Filed: Dec. 12, 2011

(65) Prior Publication Data

US 2012/0147464 A1 Jun. 14, 2012

(30) Foreign Application Priority Data

Dec. 13, 2010 (KR) ........................ 10-2010-0127189

(51) Int. Cl.
*G02B 27/22* (2006.01)
(52) U.S. Cl.
USPC .......................................................... 359/463
(58) Field of Classification Search
USPC .................... 359/462, 463, 619–622, 626
See application file for complete search history.

(56) References Cited

U.S. PATENT DOCUMENTS

| | | | | |
|---|---|---|---|---|
| 5,694,246 A | * | 12/1997 | Aoyama et al. | 359/619 |
| 6,084,713 A | * | 7/2000 | Rosenthal | 359/619 |
| 7,639,425 B2 | * | 12/2009 | Wood | 359/619 |
| 2005/0133688 A1 | * | 6/2005 | Li et al. | 250/208.1 |
| 2008/0100918 A1 | * | 5/2008 | Saville, Jr. | 359/619 |

* cited by examiner

*Primary Examiner* — James Greece
*Assistant Examiner* — Jie Lei
(74) *Attorney, Agent, or Firm* — Kile Park Reed & Houtteman PLLC

(57) ABSTRACT

A multi-layered micro lens sheet for a three-dimensional look includes a lens array layer in which first convex lenses and second convex lenses with different shapes are alternately arranged in longitudinal and transverse directions; a focal distance layer formed under the lens array layer; and a three-dimensional layer formed under the focal distance layer.

17 Claims, 3 Drawing Sheets

MULTI-LAYERED LENS SHEET FOR THREE-DIMENSIONAL LOOK

BACKGROUND OF THE INVENTION

1. Field of the Invention

The present invention relates to a lens sheet for a three-dimensional look, and more particularly, to a multi-layered lens sheet for a three-dimensional look, in which convex lenses with different shapes are alternately arranged in longitudinal and transverse directions on the surface of a transparent resin layer constituted by multiple layers of different materials, thereby accomplishing a decreased thickness and high transparency and volume of a three-dimensional image.

2. Description of the Related Art

Lens sheets are used in various fields. Representatively, lens sheets are applied to a liquid crystal display, a three-dimensional display, a surface light source device, a back light unit, a lens sheet for a three-dimensional look, etc.

FIG. 1 is a view illustrating the structure of a conventional lens sheet for a three-dimensional look.

Referring to FIG. 1, a conventional lens sheet 10 for a three-dimensional look includes a lens array layer 13 in which convex lenses 12 are arranged in arrays, a focal distance controlling transparent resin layer 14 which is formed under the lens array layer 13 and appropriately defines a focal distance in correspondence to a radius of curvature of the lenses 12, and a three-dimensional layer 11 which is formed under the focal distance controlling transparent resin layer 14 and on which a three-dimensional image is produced.

FIG. 2 is a view explaining relationships among a pitch of a lens, a radius of curvature of the lens, and a thickness of a lens array sheet for a three-dimensional look.

Referring to FIG. 2, in the relationships among a pitch 15 of a lens, a radius of curvature 42 of the lens, and a thickness of the lens sheet, an angle of view 43 is determined by the size of the radius of curvature 42 of the lens, and a focal distance for realizing a three-dimensional image is determined by the angle of view 43.

Accordingly, the focal distance controlling transparent resin layer 14 becomes thick as a refractive index of a lens medium is low and the radius of curvature 42 of the individual lens is large, and this can be readily understood from the fact that the thickness of the focal distance controlling transparent resin layer 14 is larger in the case of the right figure of FIG. 2 than in the case of the left figure of FIG. 2. Due to this fact, an overall thickness 19 of the lens array sheet increases. Conversely, the focal distance controlling transparent resin layer 14 for realizing a three-dimensional image becomes thin as the refractive index of the lens medium itself is high and the radius of curvature 42 of the individual lens is small. Due to this fact, the overall thickness 19 of the lens array sheet decreases.

FIG. 3 is of cross-sectional views showing focuses formed by changing an angle of view with respect to a three-dimensional subject placed at a focal distance in a spherical convex lens and an aspherical convex lens.

Referring to FIG. 3, when a three-dimensional subject at a focal distance is observed in front of convex lenses, focuses are precisely formed in the case of both a spherical convex lens and an aspherical convex lens. However, if the three-dimensional subject is observed by moving a field of view leftward or rightward, focuses are substantially precisely formed on the three-dimensional layer 11 in the case of the oval aspherical convex lens shown left. Therefore, the three-dimensional subject can be observed more precisely in the case of the oval aspherical convex lens than in the case of the perfect spherical convex lens shown right.

This is because a focal distance is changed as a field of view is moved leftward and rightward and the three-dimensional subject can be clearly observed only when an angle of view is within a range of a true focus depending upon the radius of curvature of a lens. Accordingly, in order to observe a three-dimensional subject through a wider range, the angle of view 43 should be increased. In this regard, since the angle of view of a spherical convex lens cannot go beyond the pitch of a lens, limitations exist.

That is to say, in a lens sheet formed into a single shape by using spherical convex lenses generally known in the art, the thickness of the lens sheet increases, a field of view is narrowed due to a narrow angle of view, and the transparency of the lens sheet becomes poor.

Meanwhile, in the case where the various layers of the lens sheet for a three-dimensional look are formed using a single material of resin, advantages and disadvantages inherent to the resin material are provided.

For example, in the case of PP (polypropylene), advantages are provided in that the price is low, and disadvantages are provided in that transparency, adhesiveness and printability are degraded. In the case of A-PET (polyethylene terephthalate), advantages are provided in terms of high transparency, high refractive index and dimensional stability, and disadvantages are provided in that adhesiveness and printability are degraded. Further, in the case of PET-G (polyethylene terephthalate-G), advantages are provided in terms of high transparency, good printability, high refractive index and dimensional stability, and disadvantages are provided in that the price is high.

SUMMARY OF THE INVENTION

Accordingly, the present invention has been made in an effort to solve the problems occurring in the related art, and an object of the present invention is to provide a multi-layered lens sheet for a three-dimensional look, in which resins of different materials are formed into multiple structural layers and are then integrated with one another, and aspherical type convex lenses with different shapes are alternately arranged in longitudinal and transverse directions.

In order to achieve the above object, according to one aspect of the present invention, there is provided a multi-layered micro lens sheet for a three-dimensional look, including: a lens array layer in which first convex lenses and second convex lenses with different shapes are alternately arranged in longitudinal and transverse directions; a focal distance controlling transparent resin layer formed under the lens array layer; and a three-dimensional layer formed under the focal distance controlling transparent resin layer.

Preferably, the first convex lenses and the second convex lenses have aspherical shapes and the same radius of curvature. More preferably, the first convex lenses comprise circular convex lenses, and the second convex lenses comprise quadrangular convex lenses.

Also, the lens array layer, the focal distance controlling transparent resin layer and the three-dimensional layer are respectively formed of resins which have different constituents.

The multi-layered micro lens sheet further includes at least one of: a first resin coating layer formed over the lens array layer; and a second resin coating layer formed between the focal distance layer and the three-dimensional layer.

The lens array layer and the focal distance layer are formed of A-PET (A-polyethylene terephthalate), and the first and second resin coating layers are formed of G-PET (G-polyethylene terephthalate).

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
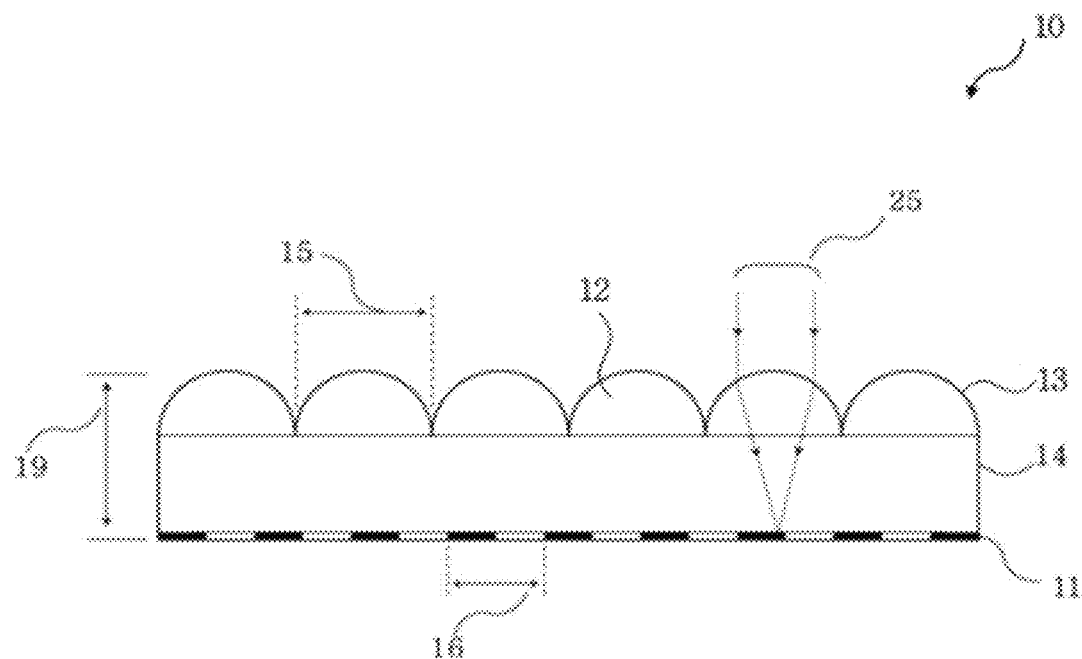
FIG. 1 is a view illustrating the structure of a conventional lens sheet for a three-dimensional look.
Figure 2:
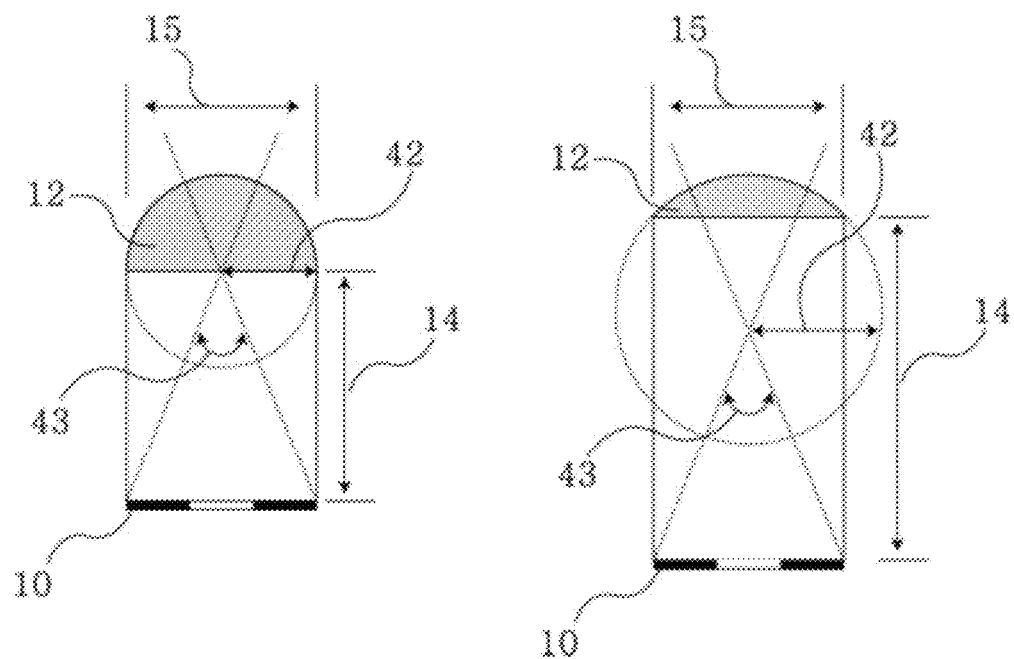
FIG. 2 is a view explaining relationships among a pitch of a lens, a radius of curvature of the lens, and a thickness of a lens array sheet for a three-dimensional look.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 4:
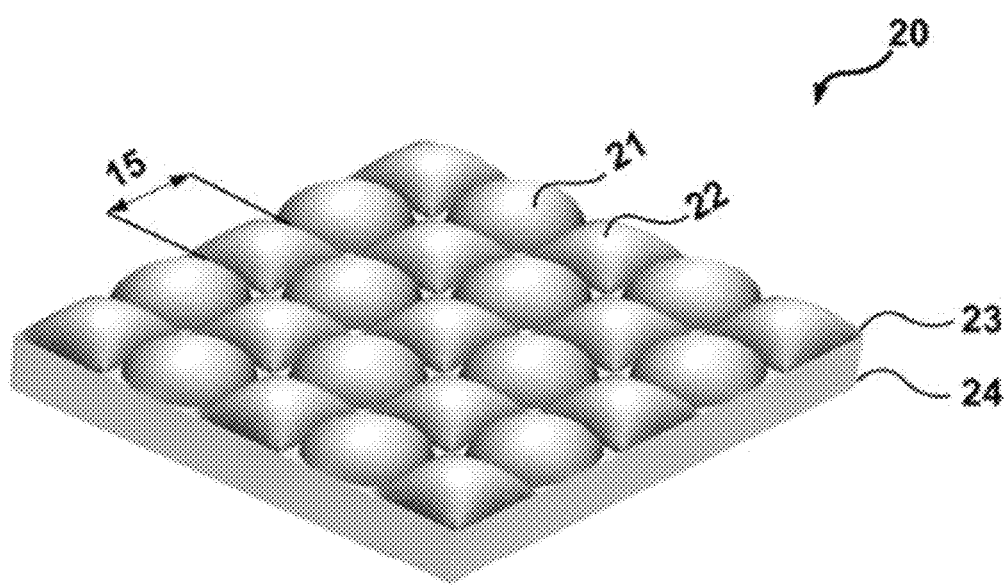
FIG. 4 is a view illustrating a multi-layered lens sheet for a three-dimensional look in accordance with an embodiment of the present invention.

FIG. 4 is a view illustrating a multi-layered lens sheet for a three-dimensional look in accordance with an embodiment of the present invention.

Figure 3:
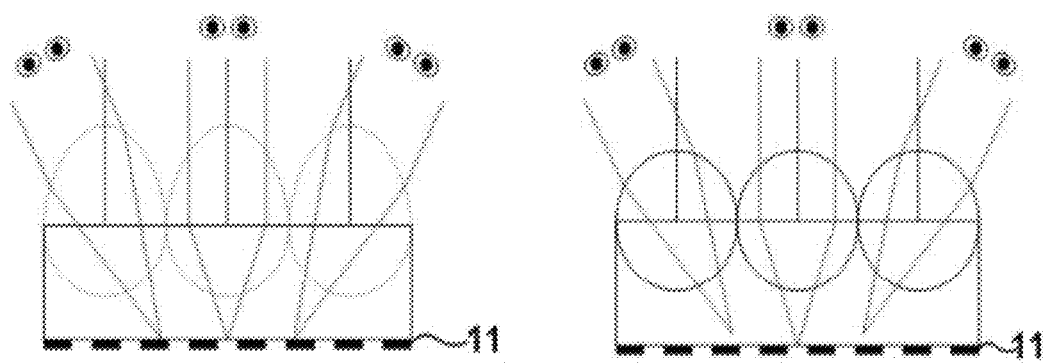
FIG. 3 is of cross-sectional views showing focuses formed by changing an angle of view with respect to a three-dimensional subject placed at a focal distance in a spherical convex lens and an aspherical convex lens.

Referring to FIG. 4, a multi-layered lens sheet 20 for a three-dimensional look in accordance with an embodiment of the present invention includes a lens array layer 23 in which first convex lenses 21 and second convex lenses 22 with different shapes are alternately arranged in longitudinal and transverse directions, a focal distance controlling transparent resin layer 24 which is formed under the lens array layer 23, and a three-dimensional layer (not shown) which is formed under the focal distance controlling transparent resin layer 24. Since the unillustrated three-dimensional layer is similar to the three-dimensional layer shown in FIG. 3, reference may be made thereto. The patterns of the three-dimensional layer may be formed through printing, otherwise embossing patterns may be formed at the same time when the lens array layer 23 and the focal distance controlling transparent resin layer 24 are formed through extrusion. When forming the patterns of the three-dimensional layer through printing, the pitch of the patterns may be set to be smaller than the pitch of the first convex lenses 21 and the pitch of the second convex lenses 22.

Preferably, the first convex lenses 21 and the second convex lenses 22 have the same radius of curvature and aspherical shapes. More preferably, when viewed from the tip, the first convex lenses 21 are circular convex lenses, and the second convex lenses 22 are quadrangular convex lenses.

Figure 5:
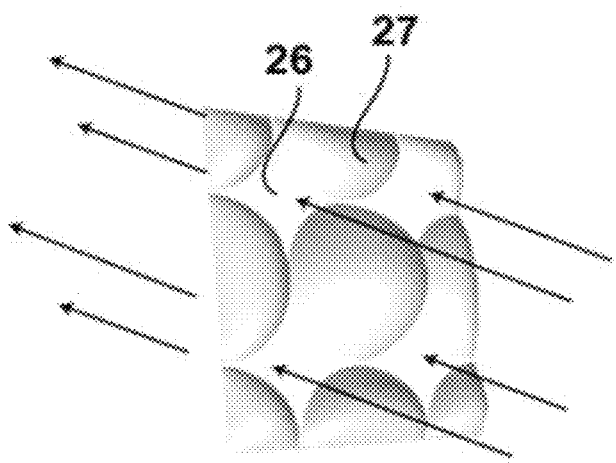
FIGS. 5 and 6 are views showing light passing through a transparent sheet portion in a multi-layered lens sheet for a three-dimensional look, which is constituted only by circular convex lenses.
Figure 6:
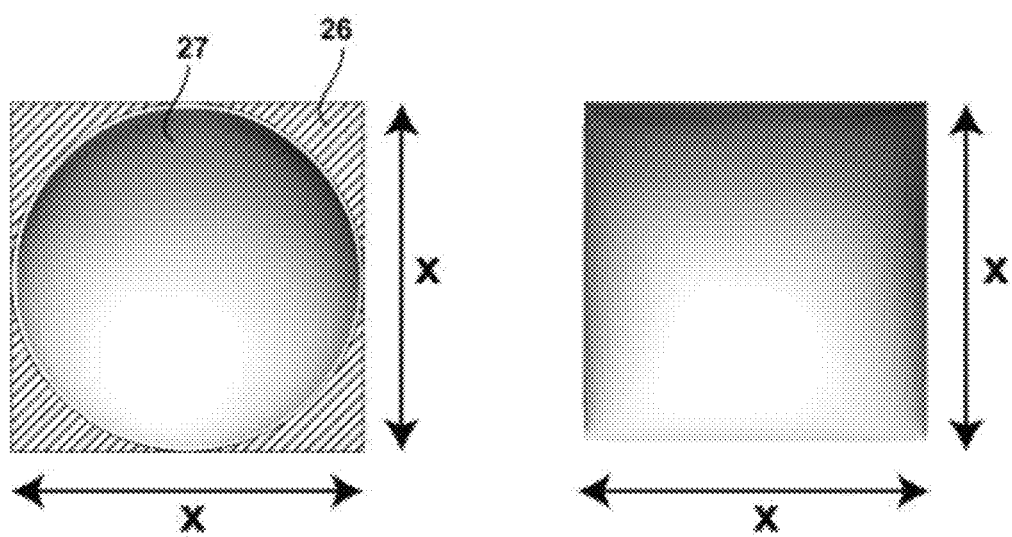

In the case of the conventional lens sheet for a three-dimensional look which is constituted only by circular convex lenses, as shown in FIGS. 5 and 6, regions 26 where light passes straight forward without being refracted are formed between lenses. These regions 26 cannot function as lenses, and simply form portions of a transparent sheet, that is, serve as non-lens regions. Two eyes of a human being observes a three-dimensional image which is positioned at the lower end of a focal distance, simultaneously through lens regions 27 and the non-lens regions 26. As the non-lens regions 26 are enlarged, the transparency of the lens sheet increases, whereas printed colors and saturation of three-dimensional embossings deteriorate, whereby the volume of a three-dimensional image is degraded.

If a micro lens sheet for a three-dimensional look is realized only using quadrangular convex lenses as shown right in FIG. 6 so as to overcome such a disadvantage, since no non-lens regions exist, colors and saturation of a three-dimensional subject are ameliorated, whereas the transparency of a lens sheet is degraded, thereby causing another problem in that the three-dimensional subject becomes unclear.

In the embodiment of the present invention, by combining the advantages of circular first convex lenses 21 and quadrangular second convex lenses 22, convex lenses are designed to have aspherical shapes and a wide angle of view. In other words, due to the fact that convex lenses constituted by lenses with different shapes are alternately arranged in longitudinal and transverse directions, three-dimensional effect and the transparency and volume of the lenses can be improved. The first convex lenses 21 and the second convex lenses 22 may have different refraction indexes. Such a combination of convex lenses is given as a mere example, and it is to be noted that the present invention is not limited to such a combination.

As a matter of course, the quadrangular convex lenses according to the present invention mean convex lenses with square pyramidal shapes. Also, as a matter of course, the shapes of the quadrangular convex lenses are not sharply and partially angled, but are slowly and continuously angled, so that the quadrangular convex lenses can sufficiently perform the functions of lenses.

In another embodiment of the present invention, a lens sheet for a three-dimensional look is manufactured in such a manner that resins of different constituents are formed into multiple structural layers and are then integrated with one another and aspherical type convex lenses with different shapes are alternately arranged in longitudinal and transverse directions on the entire surface of the integrated resin. For example, the focal distance controlling transparent resin layer 24 may be formed in such a manner that a first focal distance controlling transparent resin layer and a second focal distance controlling transparent resin layer, which are made of different materials, overlap with each other. Further, the first convex lenses and the second convex lenses, which constitute the lens array layer 23, may be constituted by double layers which are made of different resins.

Meanwhile, an adhesive surface coating agent may be applied on the lens array layer, or may be applied and then have undergone a planarization process. Otherwise, an ink-absorbing coating layer may be added on the lens array layer.

Here, for example, by coating and integrating G-PET (G-polyethylene terephthalate) on both surfaces of A-PET (A-polyethylene terephthalate), the double layers of resins may provide the advantages of low price of A-PET and the advantages of G-PET. Such a combination of resins is exemplarily provided, and it is to be noted that the present invention is not limited by any combinations of resins.

As a result of experiments conducted by the inventors in relation to the another embodiment of the present invention, G-PET is formed to the thickness of 20 microns, A-PET as a focal distance controlling transparent resin layer for a three-dimensional look is formed under the G-PET to the thickness of 50 microns, and G-PET is formed under the A-PET to the thickness of 20 microns. Therefore, aspherical circular convex lenses and quadrangular convex lenses with the same radius of curvature are alternately arranged in longitudinal and transverse directions on the surface of the integrated resin in which G-PET is coated on both sides of A-PET.

In another embodiment of the present invention, a first resin coating layer formed of a different constituent is separately formed on a lens array layer, and a second resin coating layer of a different constituent is formed between a focal distance controlling transparent resin layer and a three-dimensional layer. The first and second resin coating layers may be formed of the same or different resin constituents.

For example, the lens array layer and the focal distance controlling transparent resin layer are formed of A-PET, and the first and second resin coating layers are formed of G-PET. The lens sheet formed in this way can simultaneously provide the advantages of low price of A-PET and the advantages of G-PET. Such a combination of resins is exemplarily provided, and it is to be noted that the present invention is not limited by any combinations of resins.

As is apparent from the above description, the multi-layered lens sheet for a three-dimensional look in accordance with the embodiment of the present invention provides advantages in that a thickness is decreased when compared to the conventional lens sheet and high transparency and volume of a three-dimensional image can be ensured at any position through 360° in any direction.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A multi-layered micro lens sheet for a three-dimensional look, comprising:
   a lens array layer in which first convex lenses and second convex lenses with different shapes are alternately arranged in longitudinal and transverse directions;
   a focal distance controlling transparent resin layer formed under the lens array layer; and
   a three-dimensional layer formed under the focal distance controlling transparent resin layer so that a three-dimensional image can be observed from the three-dimensional layer,
   wherein the multi-layered micro lens sheet further comprises at least one of:
   a first resin coating layer formed over the lens array layer; and
   a second resin coating layer formed between the focal distance controlling transparent resin layer and the three-dimensional layer,
   wherein the lens array layer and the focal distance layer are formed of A-PET (A-polyethylene terephthalate), and the first and second resin coating layers are formed of G-PET (G-polyethylene terephthalate).

2. The multi-layered micro lens sheet according to claim 1, wherein the first convex lenses and the second convex lenses have aspherical shapes.

3. The multi-layered micro lens sheet according to claim 2, wherein the first convex lenses comprise circular convex lenses, and the second convex lenses comprise quadrangular convex lenses.

4. The multi-layered micro lens sheet according to claim 2, wherein the lens array layer, the focal distance controlling transparent resin layer and the three-dimensional layer are respectively formed of resins which have different constituents.

5. The multi-layered micro lens sheet according to claim 1, wherein the lens array layer, the focal distance controlling transparent resin layer and the three-dimensional layer are respectively formed of resins which have different constituents.

6. The multi-layered micro lens sheet according to claim 1, wherein the three-dimensional layer has patterns which are formed through printing.

7. The multi-layered micro lens sheet according to claim 6, wherein a pitch of the patterns formed through printing is smaller than a pitch of the first convex lenses and a pitch of the second convex lenses.

8. The multi-layered micro lens sheet according to claim 1, wherein the three-dimensional layer is formed with embossing patterns when the lens array layer and the focal distance controlling transparent resin layer are simultaneously extruded.

9. The multi-layered micro lens sheet according to claim 8, wherein a pitch of the embossing patterns is smaller than a pitch of the first convex lenses and a pitch of the second convex lenses.

10. The multi-layered micro lens sheet according to claim 1, wherein the first convex lenses have oval spherical surfaces.

11. The multi-layered micro lens sheet according to claim 1, wherein an adhesive surface coating agent is applied on the lens array layer.

12. The multi-layered micro lens sheet according to claim 11, wherein an adhesive surface coating agent is applied and planarized on the lens array layer.

13. The multi-layered micro lens sheet according to claim 1, wherein an ink-absorbing coating layer is added on the lens array layer.

14. The multi-layered micro lens sheet according to claim 1, wherein a cross-section of the second convex lenses has any one of aspherical, triangular and polygonal shapes.

15. The multi-layered micro lens sheet according to claim 1, wherein the focal distance controlling transparent resin layer is formed in such a manner that a first focal distance controlling transparent resin layer and a second focal distance controlling transparent resin layer overlap with each other.

16. The multi-layered micro lens sheet according to claim 1, wherein the first convex lenses and the second convex lenses are constituted by double layers which are made of different resins.

17. The multi-layered micro lens sheet according to claim 1, wherein the first convex lenses and the second convex lenses have different refraction indexes.

* * * * *